(12) United States Patent
Song et al.

(10) Patent No.: US 11,539,032 B2
(45) Date of Patent: Dec. 27, 2022

(54) ORGANIC LIGHT EMITTING DIODE INCLUDING ELECTRODE STRUCTURE FORMED OF TRANSPARENT ELECTRODE AND LIGHT EMITTING LAYER AND MANUFACTURING METHOD THEREOF

(71) Applicant: BOE TECHNOLOGY GROUP CO., LTD., Beijing (CN)

(72) Inventors: Zhen Song, Beijing (CN); Guoying Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 510 days.

(21) Appl. No.: 16/466,737

(22) PCT Filed: Nov. 1, 2018

(86) PCT No.: PCT/CN2018/113466
§ 371 (c)(1),
(2) Date: Jun. 5, 2019

(87) PCT Pub. No.: WO2019/184346
PCT Pub. Date: Oct. 3, 2019

(65) Prior Publication Data
US 2021/0328194 A1   Oct. 21, 2021

(30) Foreign Application Priority Data
Mar. 30, 2018 (CN) .......................... 201810276547.2

(51) Int. Cl.
*H01L 51/52* (2006.01)
(52) U.S. Cl.
CPC ...... *H01L 51/5271* (2013.01); *H01L 51/5218* (2013.01); *H01L 51/5265* (2013.01); *H01L 2251/5315* (2013.01); *H01L 2251/56* (2013.01)

(58) Field of Classification Search
CPC .................................................. H01L 51/5212
See application file for complete search history.

(56) References Cited

U.S. PATENT DOCUMENTS 5,804,918 A    9/1998  Yazawa et al.
7,615,792 B2  11/2009  Yokoyama et al.
(Continued)

FOREIGN PATENT DOCUMENTS

CN    1698218 A    11/2005
CN    1828966 A     9/2006
(Continued)

OTHER PUBLICATIONS

International Search Report of PCT/CN2018/113466 in Chinese, dated Jan. 31, 2019, with English translation.
(Continued)

*Primary Examiner* — Daniel Whalen
(74) *Attorney, Agent, or Firm* — Collard & Roe, P.C.

(57) ABSTRACT

An organic light emitting diode and a manufacturing method thereof, a display panel are provided. The organic light emitting diode includes a light emitting structure and a first electrode structure. The first electrode structure is configured to drive the light emitting structure to emit light and includes a first electrode and a light reflecting layer, the light reflecting layer is disposed on a side of the first electrode away from the light emitting structure, wherein the first electrode and at least a portion of the light reflecting layer are overlapped with each other in a first direction, an insulating layer is at least partially disposed between the at least part of the light reflecting layer and the first electrode overlapped with each other, and the first direction is perpendicular to a plane on which the light reflecting layer is located.

10 Claims, 4 Drawing Sheets

(56) References Cited

U.S. PATENT DOCUMENTS

| | | | |
|---|---|---|---|
| 7,980,911 B2 | 7/2011 | Maeda et al. | |
| 9,203,056 B1 | 12/2015 | Liu et al. | |
| 2005/0218794 A1 | 10/2005 | Seo et al. | |
| 2008/0309232 A1* | 12/2008 | Yamamoto | H01L 51/5265 313/505 |
| 2010/0200875 A1* | 8/2010 | Takei | H01L 33/00 257/91 |
| 2015/0097171 A1* | 4/2015 | Kim | H01L 27/3246 |
| 2017/0062755 A1* | 3/2017 | Im | H01L 51/5228 |

FOREIGN PATENT DOCUMENTS

| | | |
|---|---|---|
| CN | 1838427 A | 9/2006 |
| CN | 101548409 A | 9/2009 |
| CN | 101800240 A | 8/2010 |
| CN | 104091894 A | 10/2014 |
| CN | 105226197 A | 1/2016 |
| CN | 108470844 A | 8/2018 |

OTHER PUBLICATIONS

Notice of Transmittal of the International Search Report of PCT/CN2018/113466 in Chinese, dated Jan. 31, 2019.
Written Opinion of the International Searching Authority of PCT/CN2018/113466 in Chinese, dated Jan. 31, 2019 with English translation.
Chinese Office Action in Chinese Application No. 201810276547.2, dated Mar. 12, 2019 with English translation.

* cited by examiner

ORGANIC LIGHT EMITTING DIODE INCLUDING ELECTRODE STRUCTURE FORMED OF TRANSPARENT ELECTRODE AND LIGHT EMITTING LAYER AND MANUFACTURING METHOD THEREOF

CROSS REFERENCE TO RELATED APPLICATIONS

This application is the National Stage of PCT/CN2018/113466 filed on Nov. 1, 2018, which claims priority under 35 U.S.C. § 119 of Chinese Application No. 201810276547.2 filed on Mar. 30, 2018, the disclosure of which is incorporated by reference.

TECHNICAL FIELD

At least one embodiment of the present disclosure relates to an organic light emitting diode and a manufacturing method thereof, a display panel.

BACKGROUND

An Organic Light Emitting Diode (OLED) has characteristics of self-luminous, wide viewing angle, wide color gamut, fast response, high luminous efficiency, low operating voltage, and the like, and is widely used in display panel field, and the like. The OLED generally includes an anode, a cathode, and an organic functional layer between the anode and the cathode, such as a light emitting layer. In a case where an appropriate voltage is being applied to the anode and cathode of the OLED, holes injected from the anode and electrons injected from the cathode are combined in the light emitting layer and excited to generate light.

SUMMARY

At least one embodiment of the present disclosure provides an organic light emitting diode, the organic light emitting diode comprises a light emitting structure and a first electrode structure, the first electrode structure is configured to drive the light emitting structure to emit light and comprises a first electrode and a light reflecting layer, the light reflecting layer is disposed on a side of the first electrode away from the light emitting structure, the first electrode and at least a portion of the light reflecting layer are overlapped with each other in a first direction, an insulating layer is at least partially disposed between the at least portion of the light reflecting layer and the first electrode overlapped with each other, and the first direction is perpendicular to a plane on which the light reflecting layer is located.

For example, in an organic light emitting diode according to at least one embodiment of the present disclosure, the light emitting structure and the at least portion of the light reflecting layer are at least partially overlapped with each other in the first direction.

For example, an organic light emitting diode according to at least one embodiment of the present disclosure further comprises a thin film transistor, the thin film transistor is disposed on a side of the first electrode structure away from the light emitting structure.

For example, in an organic light emitting diode according to at least one embodiment of the present disclosure, the insulating layer comprises a first planar layer.

For example, in an organic light emitting diode according to at least one embodiment of the present disclosure, an optical thickness of the first planar layer is an integer multiple of a half wavelength of a light emitted by the light emitting structure at a location where the first planar layer is located.

For example, in an organic light emitting diode according to at least one embodiment of the present disclosure, a space between the at least portion of the light reflecting layer and the first electrode is all disposed with the first planar layer, the light reflecting layer is insulated from the first electrode, the thin film transistor comprises a source electrode and a drain electrode, and the first planar layer comprises a first via hole, and the first electrode is electrically connected to the source electrode and the drain electrode through the first via hole.

For example, in an organic light emitting diode according to at least one embodiment of the present disclosure, a portion of a space between the at least portion of the light reflecting layer and the first electrode overlapped with each other is disposed with the first planar layer, the light reflecting layer comprises a first portion which is overlapped and insulated with the first electrode in the first direction and a second portion which is electrically connected to the first electrode, the insulating layer is disposed between the first portion and the first electrode, a second interval is located between the first portion and the second portion, the thin film transistor comprises a source electrode and a drain electrode, the first planar layer comprises a first via hole, the second portion is at least partially located in the first via hole, and the first electrode is electrically connected to the source electrode or the drain electrode by the second portion through the first via hole.

For example, in an organic light emitting diode according to at least one embodiment of the present disclosure, the first electrode structure further comprises a transition layer; and the transition layer is disposed on a side of the light reflecting layer away from the first electrode, and the transition layer is adjacent and conformal to the light reflecting layer.

For example, in an organic light emitting diode according to at least one embodiment of the present disclosure, the first electrode structure further comprises a second planar layer, and the second planar layer is disposed on a side of the transition layer or the light reflecting layer away from the first planar layer.

For example, in an organic light emitting diode according to at least one embodiment of the present disclosure, the second planar layer comprises a second via hole, the second via hole is communicated with the first via hole; and the light reflecting layer is insulated from the first electrode, the first electrode is electrically connected to the source electrode or drain electrode through the first via hole and the second via hole.

For example, in an organic light emitting diode according to at least one embodiment of the present disclosure, the second planar layer comprises a second via hole, the second via hole is communicated with the first via hole; and the light reflecting layer comprises a first portion which is overlapped and insulated with the first electrode along the first direction and a second portion which is electrically connected to the first electrode, the insulating layer is disposed between the first portion and the first electrode, the first electrode is electrically connected to the source electrode or drain electrode by the second portion through the first via hole and the second via hole.

For example, in an organic light emitting diode according to at least one embodiment of the present disclosure, a material of the first electrode comprises one or a combination of ITO, IZO, and GZO; and a material of the light reflecting layer comprises one or a combination of Ag, Al, and AlNd.

At least one embodiment of the present disclosure provides a display panel, the display panel comprises a plurality of pixel units, and each of the pixel units comprises the organic light emitting diode according to any one of the embodiments above-mentioned.

For example, in a display panel according to at least one embodiment of the present disclosure, the light reflecting layers of the organic light emitting diodes of the adjacent pixel units are seamlessly connected.

At least one embodiment of the present disclosure provides a manufacturing method of an organic light emitting diode, the manufacturing method comprises forming a light emitting structure and forming a first electrode structure, the first electrode structure is configured to drive the light emitting structure to emit light, and the first electrode structure comprises: a first electrode; and a light reflecting layer, formed on a side of the first electrode away from the light emitting structure, and the first electrode and a portion of the light reflecting layer are overlapped with each other in a first direction, an insulating layer is at least partially disposed between the at least portion of the light reflecting layer and the first electrode overlapped with each other, and the first direction is perpendicular to a plane on which the light reflecting layer is located.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
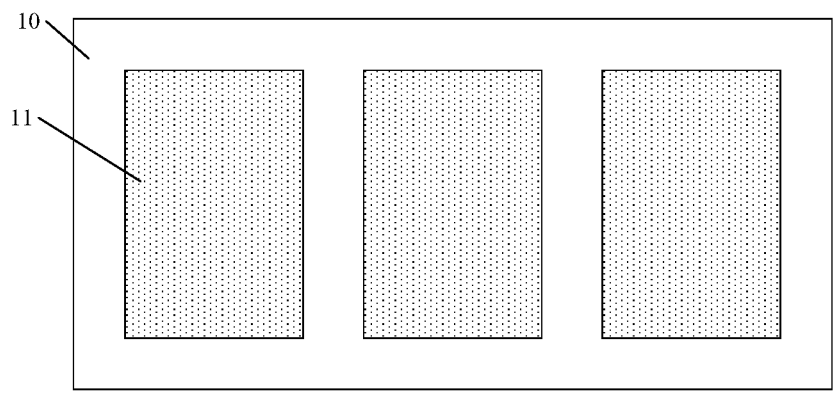
FIG. 1 is a schematic view of an organic light emitting display panel.
Figure 2:
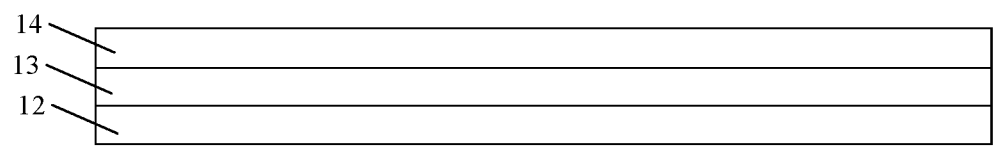
FIG. 2 is a schematic view showing an electrode structure of an organic light emitting display panel.

FIG. 1 is a schematic view of an organic light emitting display panel. In FIG. 1, an organic light emitting display panel 10 includes a plurality of pixel units 11, each of the pixel units 11 includes one organic light emitting diode. In general, an electrode structure of the organic light emitting diode, such as an anode structure, tends to be a stacked structure. For example, as shown in FIG. 2, the anode structure includes, for example, a first layer 12, a second layer 13 and a third layer 14, the first layer 12 is, for example, an ITO layer, the second layer 13 is, for example, an Ag metal layer, and the third layer 14 is, for example, an ITO layer, thereby an anode structure of an ITO/Ag/ITO stack is formed. In this structure, the first layer 12 is used, for example, as an electrode, and since the ITO layer used as an electrode is disposed adjacent to the Ag metal layer, the Ag metal will pull down a work function of the ITO electrode to some extent. The organic light emitting diode requires a high work function on the anode material, and this setting affects a power consumption and a lifetime of the organic light emitting diode. In addition, each of stacked layers constituting the anode structure is generally formed by continuous deposition and continuous etching of material of each of the stacked layers, and during forming the organic light emitting diode of each of the pixel units 11 in the organic light emitting display panel 10, large intervals are generally formed between the anode structures of the organic light emitting diodes, for example, an interval of 5-7 μm is formed. Therefore, the anode structures cannot completely shield light for an thin film transistor in the display panel 10, which adversely affecting functions such as switching of the thin film transistor, and thus adversely affecting a display effect of the display panel.

At least one embodiment of the present disclosure provides an organic light emitting diode, the organic light emitting diode includes a light emitting structure and a first electrode structure, the first electrode structure is configured to drive the light emitting structure to emit light and includes a first electrode and a light reflecting layer, the light reflecting layer is disposed on a side of the first electrode away from the light emitting structure, wherein the first electrode and at least portion of the light reflecting layer are overlapped with each other in a first direction, an insulating layer is disposed in at least portion of a space between the at least portion of the light reflecting layer and the first electrode disposed in an overlapping manner, and the first direction is perpendicular to a plane on which the light reflecting layer is located. For example, the organic light emitting diode may be applied to a display panel, and the first direction is a normal direction of a display surface of the display panel. As such, the first electrode is a single layer structure and can have a high work function and a low roughness, such that a preparation yield of the organic light emitting diode, a reliability level of the product, and the like, are improved.

At least one embodiment of the present disclosure provides a display panel, the display panel includes a plurality of pixel units, and each of the pixel units includes the organic light emitting diode according to any one of the embodiments above-mentioned.

At least one embodiment of the present disclosure provides a manufacturing method of an organic light emitting diode, the method includes: forming a light emitting structure; and forming a first electrode structure, the first electrode structure being formed to drive the light emitting structure to emit light, and the first electrode structure including: a first electrode; and a light reflecting layer, formed on a side of the first electrode away from the light emitting structure, wherein the first electrode and at least portion of the light reflecting layer are formed in an overlapping manner along a first direction, an insulating layer is formed in at least portion of a space between the at least portion of the light reflecting layer and the first electrode formed in an overlapping manner, and the first direction is perpendicular to a plane on which the light reflecting layer is located.

Hereinafter, an organic light emitting diode and a manufacturing method thereof, a display panel provided by at least one embodiment of the present disclosure are described with reference to the accompanying drawings.

Figure 3:
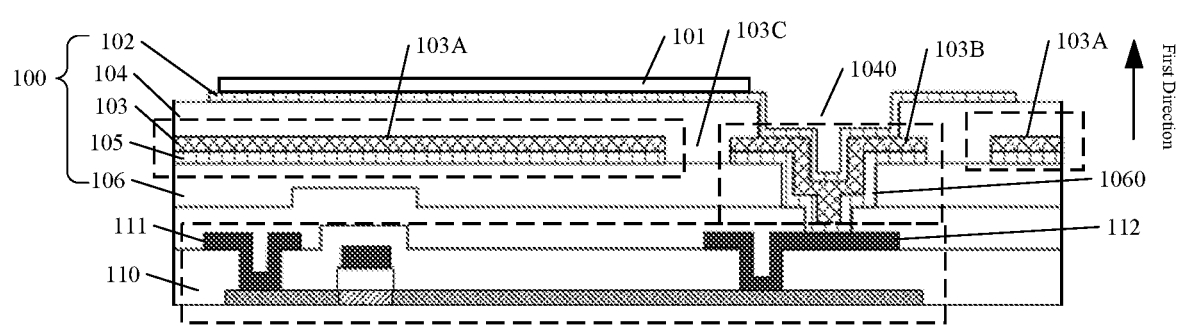
FIG. 3 is a schematic view of an organic light emitting diode according to an embodiment of the present disclosure.

At least one embodiment of the present disclosure provides an organic light emitting diode, as shown in FIG. 3, the organic light emitting diode includes a light emitting structure 101 and a first electrode structure 100, and the first electrode structure 100 is configured to drive the light emitting structure 101 to emit light. The first electrode structure 100 includes a first electrode 102 and a light reflecting layer 103, the light reflecting layer 103 is disposed on a side of the first electrode 102 away from the light emitting structure 101, the first electrode 102 and at least portion of the light reflecting layer 103 are disposed in an overlapping manner along a first direction (a direction indicated by an arrow "↑" in FIG. 3), an insulating layer is disposed in at least portion of a space between the at least portion of the light reflecting layer 103 and the first electrode 102 disposed in an overlapping manner. For example, the first direction is perpendicular to a plane on which the light reflecting layer 103 is located.

For example, in at least one embodiment of the present disclosure, the light emitting structure and the at least portion of the light reflecting layer are partially overlapped with each other in the first direction, and the first electrode and the at least portion of the light reflecting layer are disposed in an overlapping manner along the first direction. Illustratively, as shown in FIG. 3, along the first direction, the light emitting structure 101, the first electrode 102, and the light reflecting layer 103 overlap each other in a same region.

For example, as shown in FIG. 3, the insulating layer includes a first planar layer 104, the first planar layer 104 is disposed between the first electrode 102 and the at least portion of the light reflecting layer 103, such that the first electrode 102, the first planar layer 104 and the at least portion of the light reflecting layer 103 are overlapped with each other. For example, as shown in FIG. 3, the first planar layer 104 separates a first portion 103A of the light reflecting layer 103 and the first electrode 102. For example, the insulating layer may also include other insulating structures, which is not limited by at least one embodiment of the present disclosure.

For example, in at least one embodiment of the present disclosure, as shown in FIG. 3, the first electrode 102 may serve as an anode of a light emitting structure 101, in this case, the first electrode 102 and the light reflecting layer 103 are overlapped with each other and an insulating layer is disposed between the first electrode 102 and the light reflecting layer 103, such that the first electrode 102 can have a higher work function without being pulled down by the light reflecting layer 103, thereby a turn-on voltage of the organic light emitting diode can be reduced, and a lifetime of the organic light-emitting diode can be increased. In addition, the first electrode 102 having a single layer can have a lower surface roughness, for example, the surface roughness can be less than 1 nm, which is greatly reduced compared to a common electrode structure. The first electrode 102 with a low surface roughness can improve a preparation yield of the organic light emitting diode, and improve a reliability level of the product.

For example, in at least one embodiment of the present disclosure, an optical thickness of the first planar layer is an integer multiple of a half wavelength of a light emitted by the light emitting structure at a location where the first planar layer is located. For example, the light emitting structure may emit a light having a certain wavelength range, and the optical thickness of the first planar layer may be set to an integral multiple of ½ of a center wavelength of the certain wavelength range. Illustratively, as shown in FIG. 3, the optical thickness of the first planar layer 104 may be disposed to be, for example, an integral multiple of the wavelength of a light emitted by the light emitting structure 101 at the location where the first planar layer 104 is located. This disposition can enhance a microcavity effect of the organic light emitting diode. For example, the microcavity effect may be a constructive interference of the light, thereby a light emitting effect of the organic light emitting diode can be further improved. The optical thickness of the first planar layer 104 is a product of an actual thickness and a refractive index of the first planar layer 104. The microcavity effect means that in a case where a light emitting region of the organic light emitting diode is located in a resonant cavity formed by a total reflection film and a semi-reflective film, and in a case where the wavelength of the light emitted by the light emitting region is the same order of magnitude as an optical cavity length of the resonant cavity, the light of this particular wavelength is selected and enhanced.

For example, in at least one embodiment of the present disclosure, as shown in FIG. 3, the first electrode structure 100 may further includes a transition layer 105, and the transition layer 105 may be disposed on a side of the light reflecting layer 103 away from the first electrode 102 and adjacent and conformal to the light reflecting layer 103. In this embodiment, the transition layer 105 can make a bonding between the light reflecting layer 103 and other film layers of the organic light emitting diode more firmer, for example, the second planner layer 106 which will be described later more firmer.

For example, in at least one embodiment of the present disclosure, as shown in FIG. 3, the organic light emitting diode may further includes a thin film transistor 110, the thin film transistor 110 is disposed on a side of the first electrode structure 100 away from the light emitting structure 101. In this case, the light reflecting layer 103 can also have an effect of shielding light for the thin film transistor 110, thereby preventing the thin film transistor 110 from being exposed to light to affect its normal operation, and improving a light emitting stability of the organic light emitting diode.

For example, in at least one embodiment of the present disclosure, as shown in FIG. 3, the light reflecting layer 103 includes a first portion 103A which is overlapped and insulated with the first electrode 102 in a first direction and a second portion 103B which is electrically connected to the first electrode 102, a first planar layer 104 is disposed between the first portion 103A and the first electrode 102, and a second interval 103C is located between the first portion 103A and the second portion 103B. For example, a portion of a space between the at least portion of the light reflecting layer 103 and the first electrode 102 overlapped with each other is disposed with the first planar layer 104. The thin film transistor 110 includes, for example, a gate electrode, a gate insulating layer, an active layer, a source electrode 111, a drain electrode 112, and the like. The first planar layer 104 includes a first via hole 1040, and at least a portion of the second portion 103B is located in the first via hole 1040. The first electrode 102 is electrically connected to the source electrode 111 or the drain electrode 112 by the second portion 103B through the first via hole 1040 (as shown in FIG. 3, the first electrode 102 and the second portion 103B are electrically connected to the drain electrode 112).

For example, as shown in FIG. 3, a width of the second interval 103C between the first portion 103A and the second portion 103B of the light reflecting layer 103 may be about 1 μm to 3 μm, for example, 1.5 μm, 2 μm, 2.5 μm, or the like. The width of the second interval 103C is small, such that a light shielding effect of the light reflecting layer 103 is better. In this case, a contact area of the second portion 103B of the light reflecting layer 103 with the first electrode 102 is small, such that a work function of the first electrode 102 is less affected, and the work function of the first electrode 102 is maintained at a higher level.

Figure 4:
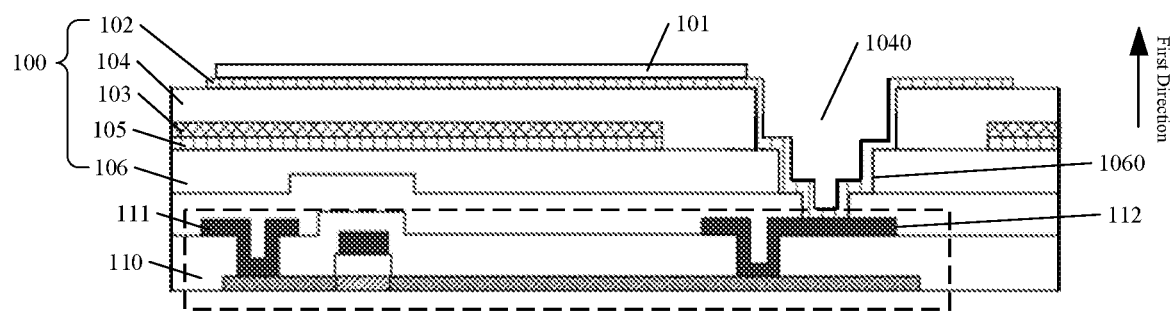
FIG. 4 is a schematic view of another organic light emitting diode according to an embodiments of the present disclosure.

For example, in at least one embodiment of the present disclosure, as shown in FIG. 4, the light reflecting layer 103 is insulated from the first electrode 102. For example, a space between the at least portion of the light reflecting layer 103 and the first electrode 102 is all disposed with the first planar layer 104. For example, the first planar layer 104 is disposed between the light reflecting layer 103 and the first electrode 102, the first planar layer 104 includes a first via hole 1040, and the first electrode 102 is electrically connected to the source electrode 111 or the drain electrode 112 through the first via hole 1040 (as shown in FIG. 4, the first electrode 102 is electrically connected to the drain electrode 112).

For example, as shown in FIG. 4, the light reflecting layer 103 is overlapped and insulated with the first electrode 102 in the first direction, such that the work function of the first electrode 102 is determined only by the first electrode 102 itself. Therefore, the first electrode 102 can have a higher work function, and can achieve a technical effect of reducing a turn-on voltage of the organic light emitting diode, improving a lifetime of the organic light emitting diode, and the like. In addition, the light reflecting layer 103 is continuously disposed except that a gap is formed at a position where the first electrode 102 and the drain electrode 112 are electrically connected, thereby an arrangement area of the light reflecting layer 103 of the present embodiment is larger, and can more effectively shield light for the thin film transistor.

For example, in at least one embodiment of the present disclosure, as shown in FIG. 3 and FIG. 4, the first electrode structure 100 may further include a second planar layer 106, and the second planar layer 106 is disposed on a side of the transition layer 105 (in a case where the organic light emitting diode includes the transition layer 105) or the light reflecting layer 103 away from the first planar layer 104. The second planar layer 106 is located between the thin film transistor 110 and the first electrode structure 100 to planarize the thin film transistor 110, so as to subsequently form other functional elements having high flatness such as the first electrode structure 100 and the like on the thin film transistor 110 in a process of manufacturing the organic light emitting diode, and a light emitting uniformity of the organic light emitting diode can be improved.

For example, in at least one embodiment of the present disclosure, as shown in FIG. 3, the second planar layer 106 includes a second via hole 1060, the second via hole 1060 is communicated with the first via hole 1040. As shown in FIG. 3, the light reflecting layer 103 includes a first portion 103A that is overlapped and insulated with the first electrode 102 in a first direction and a second portion 103B which is electrically connected to the first electrode 102, a first planar layer 104 is disposed between the first portion 103A and the first electrode 102, and the first electrode 102 is electrically connected to the source electrode 111 or the drain electrode 112 by the second portion 103B and through the first via hole 1040 and the second via hole 1060 (as shown in FIG. 3, the first electrode 102 and the second portion 103B are electrically connected to the drain electrode 112).

For example, in at least one embodiment of the present disclosure, as shown in FIG. 4, the second planar layer 106 includes a second via hole 1060 communicated with the first via hole 1040. In FIG. 4, the light reflecting layer 103 is insulated from the first electrode 102, for example, a first planar layer 104 is disposed between the light reflecting layer 103 and the first electrode 102, and the first electrode 102 is electrically connected to the source electrode 111 or the drain electrode 112 through the first via hole 1040 and the second via hole 1060 (as shown in FIG. 4, the first electrode 102 and the drain electrode 112 are electrically connected).

In at least one embodiment of the present disclosure, the first electrode structure may include two planar layers, that is, a first planar layer 104 and a second planar layer 106, an arrangement of the double-layer planar layer can improve a flatness of the organic light emitting diode and reduce a step difference between functional layers inside the organic light emitting diode, thereby the light emitting uniformity of the organic light emitting diode can be improved.

For example, in at least one embodiment of the present disclosure, the first electrode may be a transparent electrode, and the material thereof may include, for example, one or a combination of ITO, IZO, GZO, and the like. The light reflecting layer may include, for example, metal reflective materials such as metal material whose material has high light reflecting properties, for example, one or a combination of Ag, Al, AlNd, and the like. The transition layer may include, for example, a metal material, an oxide material or other material having good adhesion, for example, materials such as ITO, Mo, Ti or Mo/Ti alloy, or the like, which is used to adhere the light reflection layer to the second planar layer or other film layers. The first planar layer and the second planar layer may be formed, for example, of an organic insulating material, for example, a material such as a polysiloxane-based material, an acrylic material, a polyimide-based material, or the like. In addition, materials of the first planar layer and the second planar layer may be the same or different. At least one embodiment of the present disclosure does not specifically limit the material of each functional layer.

Figure 5:
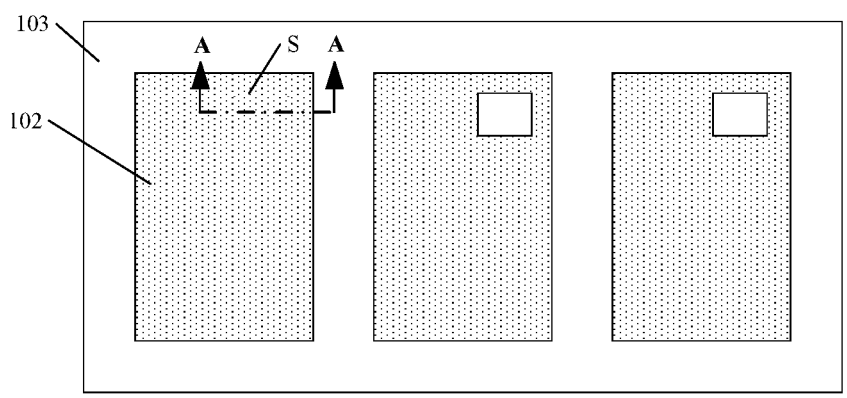
FIG. 5 is a schematic view of a display panel according to an embodiment of the present disclosure.

At least one embodiment of the present disclosure provides a display panel, as shown in FIG. 5, the display panel includes a plurality of pixel units 102, and each of the pixel units 102 includes the organic light emitting diode according to any one of the embodiments above-mentioned.

Figure 6:
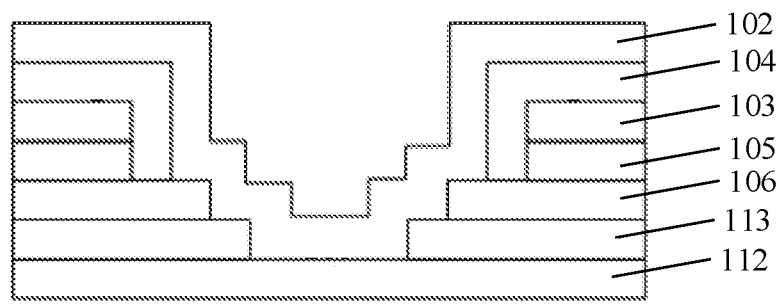
FIG. 6 is a partial cross-sectional view of a display panel according to an embodiment of the present disclosure.

For example, in some embodiments of the present disclosure, as shown in FIG. 5, the light reflecting layers 103 of the organic light emitting diodes in the adjacent pixel units 102 of the display panel are seamlessly connected, such that in a case where the display panel is being prepared, a space between the adjacent pixel units is also provided with the light reflecting layer 103, and the light reflecting layer 103 may be formed as a whole surface. Only a portion (for example, a portion shown by the small box S in FIG. 5) of the whole surface exposes the source electrode or the drain electrode of the thin film transistor, and the electrode of the organic light emitting diode is connected to the thin film transistor at this portion. For example, a cross-sectional view of the portion shown by the small block S and its vicinity (for example, a cross-sectional view along line A-A) are as shown in FIG. 6, and the first electrode 102 is directly electrically connected to the drain electrode 112 of the thin film transistor (for example, a case shown in FIG. 4), such that the first electrode 102 can have a higher work function.

For example, in other embodiments of the present disclosure, in a case where the light reflecting layer 103 includes a first portion 103A which is overlapped and insulated with the first electrode 102 in a first direction and a second portion 103B which is electrically connected to the first electrode 102, a small gap between the first portion 103A and the second portion 103B formed in the light reflecting layer 103 is used to separate the first portion 103A and the second portion 103B, and the first electrode 102 is electrically connected to the drain electrode 112 of the thin film transistor through the second portion 103B, in this case (for example, a case shown in FIG. 3), the first electrode 102 can also have a higher work function, and except for the small gap for separating the first portion 103A and the second portion 103B, a remaining portion of the light reflecting layer 103 is continuously disposed. Compared with a case that the light reflecting layer is formed with large gaps between different pixel units, a disposition area of the light reflecting layer 103 of the present embodiment is larger, and can more effectively shield light for the thin film transistor.

In at least one embodiment of the present disclosure, the light-reflecting layer 103 having a whole surface design or a nearly whole surface design can effectively shield light for the thin film transistor in the display panel, such that the thin film transistor is prevented from being affected due to being irradiated by light, thereby improving an light irradiation stability of the display panel, and improving a display effect of the display panel.

At least one embodiment of the present disclosure provides a manufacturing method of an organic light emitting diode includes: forming a light emitting structure and a first electrode structure, the first electrode structure is formed to drive the light emitting structure to emit light. The first electrode structure includes a first electrode and a light reflecting layer, the light reflecting layer is formed on a side of the first electrode away from the light emitting structure, and at least a portion of the light reflecting layer is formed to separate from the first electrode in a direction perpendicular to a plane on which the light reflecting layer is located. For example, the first electrode and the at least portion of the light reflecting layer are formed in an overlapping manner along a first direction, and an insulating layer is formed in at least portion of a space between the at least portion of the light reflecting layer and the first electrode overlapped with each other, and the first direction is perpendicular to a plane on which the light reflecting layer is located. In the organic light emitting diode obtained by the manufacturing method, the first electrode is a single layer structure and can have a high work function and a low roughness, such that a preparation yield of the organic light emitting diode, a reliability level of the product, and the like, can be improved.

For example, a manufacturing method provided by at least one embodiment of the present disclosure will be described in detail by taking an organic light emitting diode shown in FIG. 3 as an example. For example, FIG. 7A—FIG. 7F show schematic cross-sectional views of an organic light emitting diode in a preparation process.

Figure 7A:
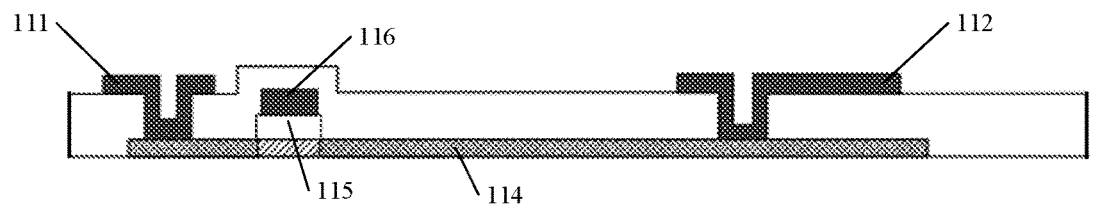
FIG. 7A-FIG. 7F are schematic cross-sectional views of an organic light emitting diode in a preparation process according to some embodiments of the present disclosure.

As shown in FIG. 7A, a thin film transistor is formed, the thin film transistor may include, for example, an active layer 114, a gate insulating layer 115, a gate electrode 116, a source electrode 111, a drain electrode 112, and the like. A formation process of each functional layer may include, for example, forming a material layer by a method such as sputtering or deposition, patterning the material layer by a patterning process, and the like. The patterning process may include, for example, a process of coating, exposing, developing, and etching a photoresist. For example, an active layer 114 may be formed using a material such as an oxide material, a silicon material, or an organic material, for example, a material such as a-IGZO, ZnON, IZTO, a-Si, p-Si, sexithiophene, polythiophene, or the like. A gate insulating layer 115 may be formed of, for example, an inorganic material or an organic material, such as an inorganic material such as $SiO_x$, $SiN_x$ or SiON, a material having a high dielectric constant such as $AlO_x$, $HfO_x$, $TaO_x$ or an organic material such as polyimide or the like. The gate electrode 116, the source electrode 111, and the drain electrode 112 may be formed of, for example, a metal material such as Ag, Cu, Al, or Mo, or a metal alloy material such as AlNd or MoNb, or a multilayer of metal materials such as MoNb/Cu/MoNb or the like, or a multilayer structure formed of a metal and a transparent conductive oxide (for example, ITO, AZO, or the like), such as ITO/Ag/ITO or the like. In addition, the materials of the gate electrode 116, the source electrode 111, and the drain electrode 112 may be the same or different. In this embodiment, the forming material and the forming method of each functional layer are not specifically limited.

It should be noted that, in at least one embodiment of the present disclosure, the type of the thin film transistor is not limited to a top gate type thin film transistor shown in FIG. 7A, and the type of the thin film transistor may be configured as a bottom gate type thin film transistor, a thin film transistor of double gate type, or a thin film transistor of other types. For example, in a case where the thin film transistor is a bottom gate type thin film transistor, a reflective electrode can block a light emitted by the light emitting structure from being incident on the thin film transistor (for example, an active layer therein), such that it is not necessary to additionally provide a light shielding layer on the active layer, thereby a preparation process of the thin film transistor is simplified and a cost is reduced.

For example, a base substrate may be provided, and then a thin film transistor is formed on the base substrate. The base substrate may be a rigid substrate, or a flexible substrate for a field of flexible display. For example, in a case where the base substrate is the rigid substrate, the base substrate may be a glass plate, a quartz plate, a resin plate, or the like. For example, in a case where the base substrate is the flexible substrate, a material of the base substrate may include an organic material, for example, the organic material may be resin-based materials such as polyimide, polycarbonate, polyacrylate, polyetherimide, polyethersulfone, polyethylene terephthalate, polyethylene naphthalate, and the like.

Figure 7B:
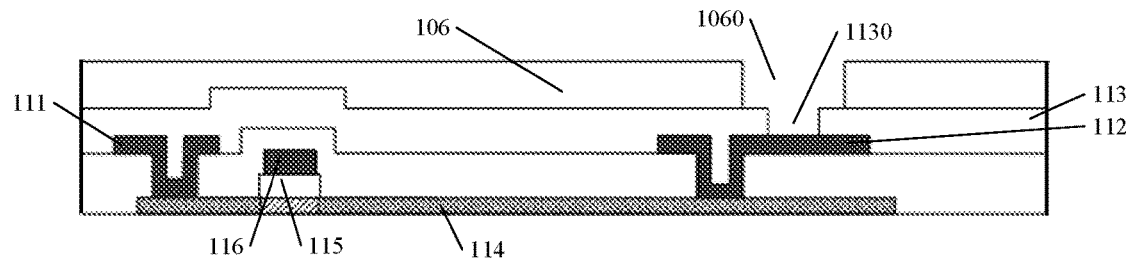

As shown in FIG. 7B, after the thin film transistor is formed, a passivation layer 113 may be formed on the thin film transistor, and a third via hole 1130 may be formed in the passivation layer 113. For example, firstly, a passivation material layer may be formed by a method such as deposition or the like, and then the passivation material layer is patterned by a photolithography process to form a third via hole 1130 to connect the drain electrode 112 of the thin film transistor to other conductive structures (for example, the second portion 103B/105B described below).

In at least one embodiment of the present disclosure, the material of the passivation layer may be an inorganic material or an organic material, for example an inorganic material such as $SiO_x$, $SiN_x$ or SiON, or the like, a material having a high dielectric constant such as $AlO_x$, $HfO_x$, $TaO_x$ and the like, or organic materials such as polyimide or the like.

For example, as shown in FIG. 7B, after the passivation layer 113 is formed, a second planar layer 106 may be formed, and a second via hole 1060 connected to the third via hole 1130 is formed in the second planar layer 106. For example, a layer of a second planar material layer may be formed by deposition, and then the second planar material layer is patterned by a photolithography process to form the second via hole 1060 to connect the drain electrode 112 of the thin film transistor to other conductive layers (for example, a second portion 103B/105B described below). For example, the second planar layer 106 may include, for example, an organic insulating material such as a polysiloxane-based material, an acrylic-based material, a polyimide-based material, or the like.

Figure 7C:
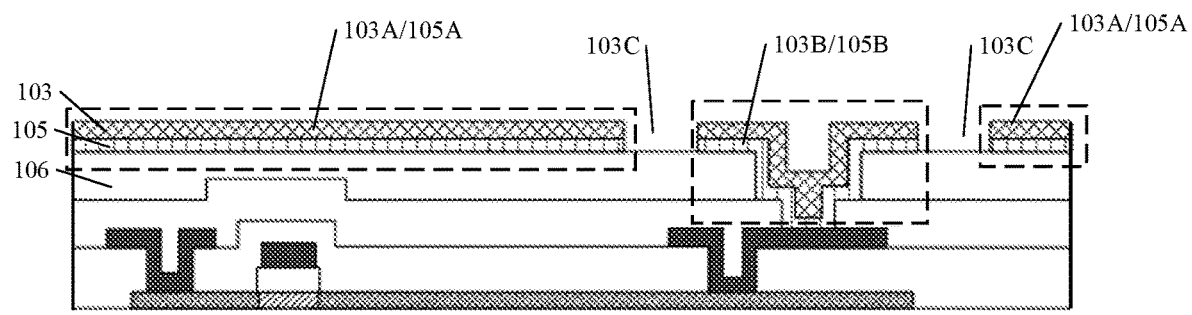

As shown in FIG. 7C, after the second planar layer 106 is formed, the transition layer 105 and the light reflecting layer 103 may be formed. For example, the transition layer 105 and the light reflecting layer 103 may be conformal, such that a transition material layer and a light reflective material layer may be continuously deposited, and then the transition material layer and the light reflective material layer are simultaneously patterned by a single photolithography process to form the transition layer 105 and the light reflecting layer 103 which are conformal. In this example, the transition layer 105 and the light reflecting layer 103 both include a second portion 103B/105B formed to be electrically connected to the drain electrode 112 of the thin film transistor and a first portion 103A/105A formed to be insulated from the second portion 103B/105B. For example, a second interval 103C may be formed between the second portion 103B/105B and the first portion 103A/105A during performing a photolithography process, so as to insulate the second portion 103B/105B from the first portion 103A/105A. A formation width of the second interval 103C may be, for example, about 1 μm to 3 μm, for example, 1.5 μm, 2 μm, 2.5 μm, or the like. The transition layer 105 may include, for example, a metal material, an oxide material or other material having good adhesion, for example, materials such as ITO, Mo, Ti or Mo/Ti alloy, or the like, The light reflecting layer 103 may include, for example, a material having a high reflectance to light such as a metal material such as Ag, Al, AlNd, or the like. The transition layer 105 can better bond the light reflecting layer 103 and the second planar layer 106 together.

Figure 7D:
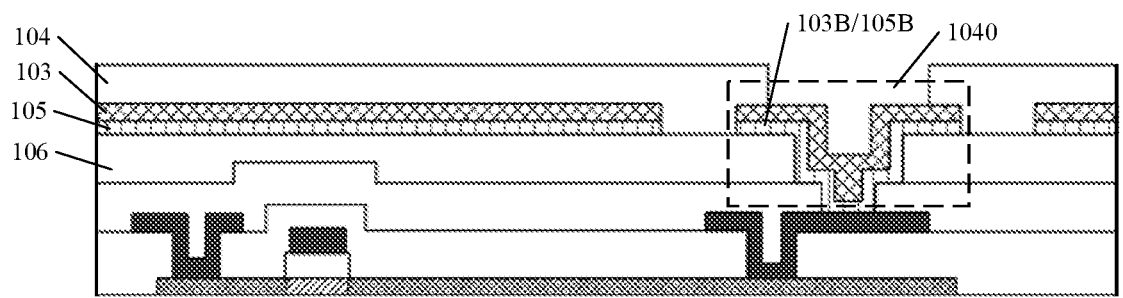

As shown in FIG. 7D, after the transition layer 105 and the light reflecting layer 103 are formed, a first planar layer 104 may be formed, and a first via hole 1040 is formed in the first planar layer 104. For example, firstly, a layer of a first planar material layer may be formed by deposition, and then the first planar material layer is patterned by a photolithography process to form a first via hole 1040 exposing the transition layer 105 and the second portion 103B/105B of the light reflecting layer 103, so as to electrically connect the drain electrode 112 of the thin film transistor to other conductive structures (for example, the first electrode 102). For example, the first planar layer 104 may be formed of an organic insulating material, for example, a polysiloxane-based material, an acrylic-based material, a polyimide-based material, or the like.

Figure 7E:
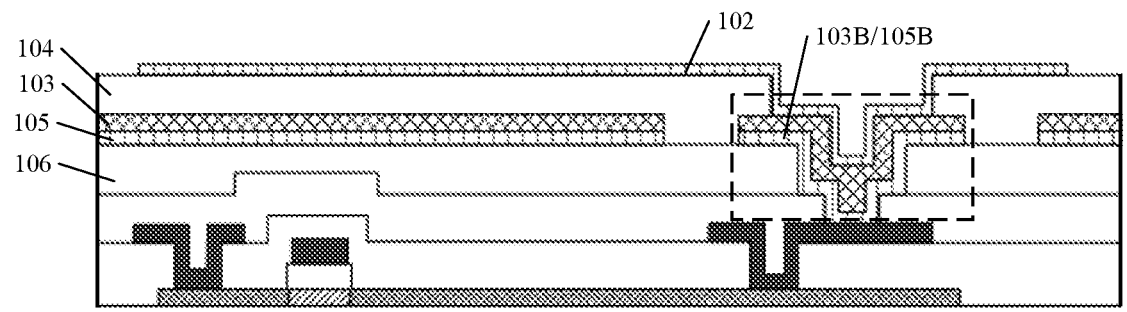

As shown in FIG. 7E, after the first planar layer 104 is formed, a first electrode 102 may be formed. For example, a layer of a first electrode material layer may be formed by deposition (for example, physical or chemical vapor deposition, magnetron sputtering, or the like), the first electrode material layer is formed on the first planar layer 104 and a portion of the transition layer 105 and the second portion 103B/105B of the light reflecting layer 103 which is exposed, then the first electrode material layer is patterned by a photolithography process to form the first electrode 102. The first electrode 102 is electrically connected to the drain electrode 112 of the thin film transistor through the transition layer 105 and the second portion 103B/105B of the light reflecting layer 103. For example, the material of the first electrode 102 may be a transparent conductive material such as ITO, IZO, GZO, or the like.

Figure 7F:
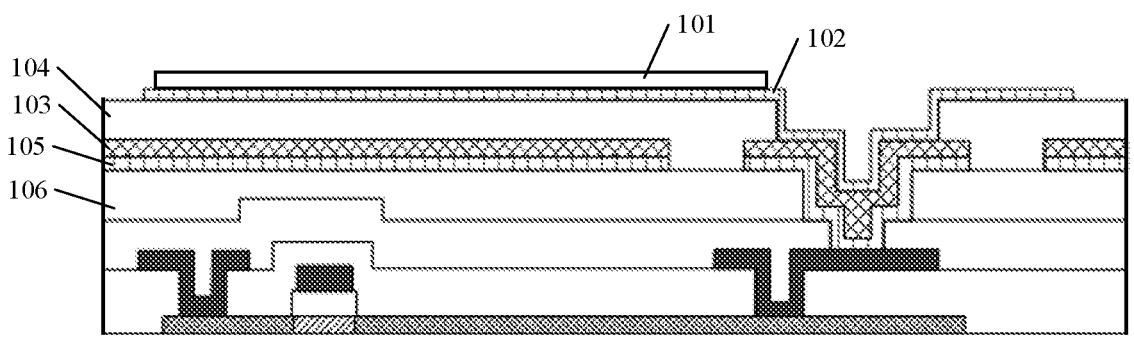

As shown in FIG. 7F, after the first electrode 102 is formed, other structures such as a light emitting structure 101, a second electrode (not shown in FIG. 7F), and the like, may be formed. For example, the light emitting structure 101 may include an organic light emitting material, in this case, the first electrode 102 and the second electrode may respectively serve as an anode and a cathode of the organic light emitting diode to drive the light emitting structure 101 to emit light.

For example, in some embodiments, in a case where the organic light emitting diode shown in FIG. 4 is manufactured, the manufacturing method thereof may be substantially the same as the manufacturing method of the embodiments above-mentioned, and a difference is that patterns of the transition material layer and the light reflecting material layer are different after a continuous deposition of the transition material layer and the light reflecting material layer. Illustratively, the transition layer and the light reflecting layer which have been patterned are not formed in the via hole of the second planar layer, that is, all of the transition layer and the light reflecting layer are not in contact with the first electrode and an insulating layer is disposed between the first electrode, and the transition layer and the light reflecting layer. Manufacturing methods of other structures may refer to the embodiments above-mentioned, which is not described herein again.

In at least one embodiment of the present disclosure, the first electrode 102 and the light reflecting layer 103 are overlapped with each other and an insulating layer is disposed between the first electrode 102 and the light reflecting layer 103, such that the first electrode 102 can have a higher work function without being pulled down by the light reflecting layer 103, thereby a turn-on voltage of the organic light emitting diode can be reduced, and a lifetime of the organic light-emitting diode can be increased. In addition, the first electrode 102 having a single layer can have a lower surface roughness, for example, the surface roughness can be less than 1 nm, which is greatly reduced compared to a common electrode structure. The first electrode 102 with a low surface roughness can improve a preparation yield of the organic light emitting diode, and improve a reliability level of the product.

In at least one embodiment of the present disclosure, the light reflecting layer 103 can also have an effect of shielding light for the thin film transistor, thereby preventing the thin film transistor 110 from being exposed to light to affect its normal operation, and improving an illumination stability of the organic light emitting diode. In addition, the first electrode structure may include two planar layers, an arrangement of double-layer planar layer can improve a flatness of the organic light emitting diode and reduce a step difference between the functional layers inside the organic light emitting diode, thereby the light emitting uniformity of the organic light emitting diode can be improved.

At least one embodiment of the present disclosure provides a manufacturing method of a display panel, the method includes: forming a plurality of pixel units, and forming an organic light emitting diode in each of the pixel units by the method above-mentioned.

For example, the light reflecting layers 103 of the organic light emitting diodes in the adjacent pixel units 102 are formed to be seamlessly connected. For example, the light reflecting layer 103 may be formed as a whole surface, then the light reflecting layer 103 having a whole surface is patterned by a photolithography process to form a patterned light reflecting layer 103. Compared with a case that the light reflecting layer is formed with large gaps between different pixel units, the light reflecting layer 103 having a whole surface design can effectively shield light for the thin film transistors in the display panel, such that a normal operation of the thin film transistor is adversely affected by the light irradiation, thereby improving a light irradiation stability of the display panel, and improving a display effect of the display panel.

For the present disclosure, the following points should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined to obtain new embodiments.

The foregoing are merely specific embodiments of the invention, but not limitative to the protection scope of the invention. Within the technical scope disclosed by the present disclosure, any alternations or replacements which can be readily envisaged by one skilled in the art shall be within the protection scope of the present disclosure. Therefore, the protection scope of the invention shall be defined by the accompanying claims.

What is claimed is:

1. An organic light emitting diode, comprising:
a light emitting structure; and
a first electrode structure, configured to drive the light emitting structure to emit light, and comprising:
a first electrode, in a single layer structure formed of a conductive material; and
a light reflecting layer, disposed on a side of the first electrode away from the light emitting structure, and configured to reflect light emitted by the light emitting structure toward the light emitting structure,
wherein the first electrode and at least a portion of the light reflecting layer are overlapped with each other in a first direction, an insulating layer is at least partially disposed between the at least portion of the light reflecting layer and the first electrode overlapped with each other, and the first direction is perpendicular to a plane on which the light reflecting layer is located,
the first electrode structure further comprises a transition layer, the transition layer is disposed on a side of the light reflecting layer away from the first electrode, and the transition layer is adjacent and conformal to the light reflecting layer,
the insulating layer comprises a first planar layer,
a portion of a space between the at least portion of the light reflecting layer and the first electrode overlapped with each other is disposed with the first planar layer, the light reflecting layer comprises a first portion which is overlapped and insulated with the first electrode in the first direction and a second portion which is electrically connected to the first electrode, the insulating layer is disposed between the first portion and the first electrode, a second interval is located between the first portion and the second portion,
the thin film transistor comprises a source electrode and a drain electrode, the first planar layer comprises a first via hole, the second portion is at least partially located in the first via hole, and the first electrode is electrically connected to the source electrode or the drain electrode by the second portion through the first via hole,
the first electrode structure further comprises a second planar layer, and the second planar layer is disposed on a side of the transition layer or the light reflecting layer away from the first planar layer,
the second planar layer comprises a second via hole,
at least portion of the second portion, at least portion of the transition layer and at least portion of the first electrode are located in the second via, and
the second portion, the transition layer and the first electrode are electrically connected.

2. The organic light emitting diode according to claim 1, wherein the light emitting structure and the at least portion of the light reflecting layer are at least partially overlapped with each other in the first direction.

3. The organic light emitting diode according to claim 1, further comprising:
a thin film transistor, disposed on a side of the first electrode structure away from the light emitting structure.

4. The organic light emitting diode according to claim 1, wherein
an optical thickness of the first planar layer is integer multiple of a half wavelength of light emitted by the light emitting structure at a location where the first planar layer is located.

5. The organic light emitting diode according to claim 1, wherein
the second planar layer comprises a second via hole, the second via hole is communicated with the first via hole; and
the first electrode is electrically connected to the source electrode or drain electrode by the second portion through the first via hole and the second via hole.

6. The organic light emitting diode according to claim 1, wherein a material of the first electrode comprises one or a combination of ITO, IZO, and GZO; and
a material of the light reflecting layer comprises one or a combination of Ag, Al, and AlNd.

7. A display panel, comprising a plurality of pixel units, wherein each of the pixel units comprises the organic light emitting diode according to claim 1.

8. The display panel according to claim 7, wherein the light reflecting layers of the organic light emitting diodes of the adjacent pixel units are seamlessly connected.

9. The organic light emitting diode according to claim 1, wherein the second planar layer is located between the light reflecting layer and the thin film transistor.

10. A manufacturing method of an organic light emitting diode, comprising:
forming a light emitting structure; and
forming a first electrode structure, the first electrode structure being configured to drive the light emitting structure to emit light,
and the first electrode structure comprising:
a first electrode, in a single layer structure formed of a conductive material; and
a light reflecting layer, formed on a side of the first electrode away from the light emitting structure, and configured to reflect light emitted by the light emitting structure toward the light emitting structure,
wherein the first electrode and a portion of the light reflecting layer are overlapped with each other in a first direction, an insulating layer is at least partially disposed between the at least portion of the light reflecting layer and the first electrode overlapped with each other, and the first direction is perpendicular to a plane on which the light reflecting layer is located,
the first electrode structure further comprises a transition layer, the transition layer is disposed on a side of the light reflecting layer away from the first electrode, and the transition layer is adjacent and conformal to the light reflecting layer,
the insulating layer comprises a first planar layer,
a portion of a space between the at least portion of the light reflecting layer and the first electrode overlapped with each other is disposed with the first planar layer, the light reflecting layer comprises a first portion which is overlapped and insulated with the first electrode in the first direction and a second portion which is electrically connected to the first electrode, the insulating layer is disposed between the first portion and the first electrode, a second interval is located between the first portion and the second portion,
the thin film transistor comprises a source electrode and a drain electrode, the first planar layer comprises a first via hole, the second portion is at least partially located in the first via hole, and the first electrode is electrically connected to the source electrode or the drain electrode by the second portion through the first via hole,
the first electrode structure further comprises a second planar layer, and the second planar layer is disposed on a side of the transition layer or the light reflecting layer away from the first planar layer,
the second planar layer comprises a second via hole,
at least portion of the second portion, at least portion of the transition layer and at least portion of the first electrode are located in the second via, and
the second portion, the transition layer and the first electrode are electrically connected.

* * * * *